(12) United States Patent
Ueda et al.

(10) Patent No.: US 6,399,879 B1
(45) Date of Patent: Jun. 4, 2002

(54) ELECTROMAGNETIC SHIELD PLATE

(75) Inventors: Kayoko Ueda, Takatsuki; Hajime Kuwahara, Niihama; Toshiya Inoue, Toyonaka; Masakazu Shirakawa, Minoo, all of (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/427,740

(22) Filed: Oct. 27, 1999

(30) Foreign Application Priority Data

Oct. 30, 1998 (JP) .......................... 10-310669
Nov. 26, 1998 (JP) .......................... 10-335624

(51) Int. Cl.$^7$ ................................ H05K 9/00
(52) U.S. Cl. ................. 174/35 MS; 174/35 R
(58) Field of Search ................. 174/35 MS, 35 R; 361/818, 816; 348/819, 820; 428/209, 349, 457, 488

(56) References Cited

U.S. PATENT DOCUMENTS 4,910,090 A    3/1990   Kuhlman et al. ............ 428/469
4,978,812 A   12/1990   Akeyoshi et al. ......... 174/35 MS
6,086,979 A    7/2000   Kanbara et al. .............. 428/209
6,147,302 A  * 11/2000   Matsuo et al. ............. 174/35 R

FOREIGN PATENT DOCUMENTS

| EP | 0 8410 542 A | 5/1998 |
| JP | 61 134 189 A | 6/1986 |
| JP | 62057297 A | 3/1987 |
| JP | 2-52499 | 2/1990 |
| JP | 05 283 889 A | 10/1993 |
| JP | 10 056 290 A | 2/1998 |
| JP | 10-79594 | 3/1998 |
| JP | 10 079 594 A | 3/1998 |
| JP | 10-341093 | 12/1998 |
| JP | 11-145676 | 5/1999 |

* cited by examiner

Primary Examiner—Dean A. Reichard
Assistant Examiner—Carmelo Oliva
(74) Attorney, Agent, or Firm—Sughrue Mion, PLLC

(57) ABSTRACT

An electromagnetic shield plate comprising a geometric pattern having a line width of 10 $\mu$m to 80 $\mu$m and a line interval of 50 to 250 mesh on a surface of a transparent substrate, provides good visibility and excellent electromagnetic shielding, and is easy to manufacture and permits the fabrication of a large-size plate in a simple manner.

22 Claims, 2 Drawing Sheets

ELECTROMAGNETIC SHIELD PLATE

BACKGROUND OF THE INVENTION

1. Field of the Invention

The present invention relates to an electromagnetic shield plate.

2. Description of the Related Art

Electromagnetic shield plates have been used widely as front panels to be mounted in front of display screens to provide, for example, a shield from electromagnetic radiation leaking from the front side of the display. Electromagnetic shield plates used as the front panels are required not to degrade the visibility of the display screen, while providing the function of shielding electromagnetic radiation.

One known type of such electromagnetic shield plates is constructed, for example, by bonding an electrically conductive mesh to a substrate. The conductive mesh is formed by weaving an electrically conductive fiber in a grid pattern; for example, a polyester fiber or the like whose surface is coated with a metallic thin film is used as the electrically conductive fiber.

However, electromagnetic shield plates using such a conductive mesh have had the problem that the conductive mesh that has to be used in the fabrication process is a fabric which is likely to expand and contract during the fabrication and is therefore not easy to handle. Furthermore, when using the electromagnetic shield as a front panel, its transmittance of light in the visible spectrum must be increased, and to achieve this, the grid interval of the conductive mesh must be increased and the fiber diameter be reduced, making it imperative to use a conductive mesh more prone to expanding and contracting and hence more difficult to handle. This has involved the further problem that the grid interval tends to become displaced and distortion of the grid pattern tends to occur when bonding such an easily expanding and contracting conductive mesh to the substrate.

One possible solution to such problems may be to use an electromagnetic shield plate constructed with an etching sheet formed by etching a metallic foil in a grid pattern and bonded to the surface of the substrate; however, if the front panel is to be usedwith a large-screen display such as a plasma display or a large-size CRT, a large-area metallic foil that matches the screen size must be etched in a grid pattern. This necessitates the use of a large-scale photolithographic process, and it cannot be said that such shield plates are easy to fabricate.

On the other hand, there has been proposed an electromagnetic :shield plate constructed by printing an electrically conductive paint in a grid pattern or a stripe pattern (Japanese Unexamined Patent Publication Nos. 62-57297 and 02-52499), but this electromagnetic shield plate has a grid interval of 1000 $\mu$m and a line width of 100 $\mu$m and does not necessarily provide sufficient electromagnetic shielding properties; furthermore, visibility is also insufficient because the grid lines tend to be visible.

SUMMARY OF THE INVENTION

In view of the above situation, the present inventors have conducted intensive studies to develop an electromagnetic shield plate that is easy to fabricate even in large size and that provides excellent visibility and electromagnetic shielding properties, and found that an electromagnetic shield plate that is easy to fabricate even in large size and that provides excellent visibility and electromagnetic shielding properties can be obtained by forming a geometric pattern having a line width of 10 $\mu$m to 80 $\mu$m and a line interval of 50 to 250 mesh on a transparent substrate surface by the use of a printing method, and this finding has lead to the present invention.

Accordingly, an object of the present invention is to provide an electromagnetic shield plate comprising a geometric pattern having a line width of 10 $\mu$m to 80 $\mu$m and a line interval of 50 to 250 mesh on a surface of a transparent substrate.

DESCRIPTION OF THE PREFERRED EMBODIMENTS

Figure 1:
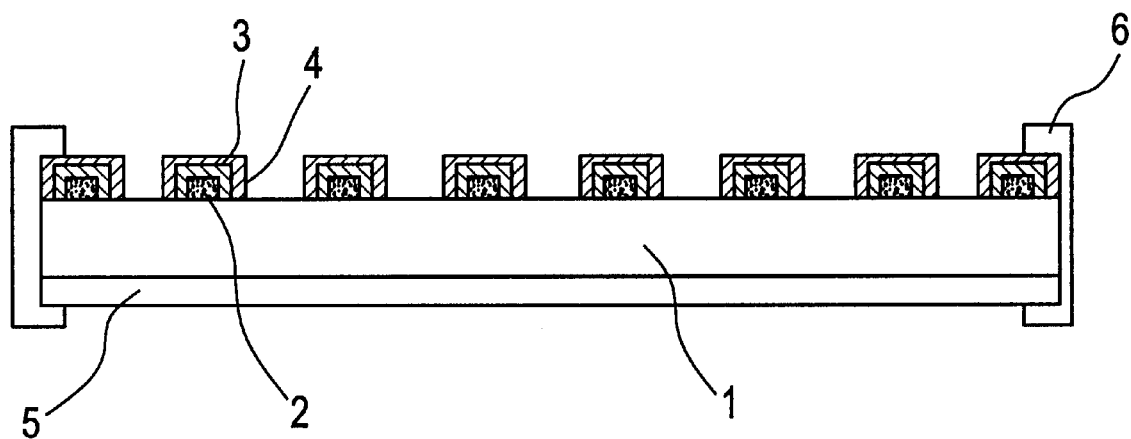
FIG. 1 is a vertical cross sectional view of an electromagnetic shield plate obtained in Example 4.

The electromagnetic shield plate of the present invention includes an electrically conductive geometric pattern on a surface of a transparent substrate (hereinafter simply referred to as the substrate). The conductive geometric pattern may be formed directly on the surface of the substrate, or a film with the conductive geometric pattern formed thereon may be laminated to the substrate.

The substrate is not specifically limited in material, but any substrate can be used as long as it is transparent and can be placed in front of a display screen; for example, a glass substrate, an acrylic resin plate, a polycarbonate resin plate, an ester-based resin plate such as a polyethylene terephthalate plate, a polyolefin-based resin plate such as a polyethylene plate or a polypropylene plate, or other synthetic resin plate such as a polyether sulfone plate, can be used as the substrate. The thickness of the substrate is usually about 0.5 mm to about 20 mm, and preferably within the range of about 1 mm to about 10 mm.

For the film on which the conductive geometric pattern is formed, a synthetic resin film can be used, for example, a polyester-based resin film such as a polyethylene terephthalate film, or a polyolefin-based resin film such as a polyethylene film or a polypropylene film. The thickness of the film is usually within the range of about 0.04 mm to about 0.3 mm.

The substrate may be colored with a coloring material such a dye or a pigment. Coloring is often done for the purpose of improving the visibility of the display.

The substrate may also contain other additives; for example, when the electromagnetic shield plate is used as a front panel for a plasma display panel, the substrate may contain a near-infrared light absorbing material for absorbing the near-infrared radiation being emitted from the front of the display.

When using a synthetic resin plate as the substrate, the surface of the plate may be covered with a hard coat layer. Such a substrate may be formed from a single plate consisting of a single layer, or from a composite plate consisting of two or more like or unlike layers.

The geometric pattern provided on the surface of the substrate consists of lines formed from an electrically conductive paste, an electrically conductive metal or an electrically conductive metal oxide.

The electrically conductive paste here refers to a composition consisting of electrically conductive particles or scales and a binder, the electrically conductive particles or scales being dispersed through the binder. Examples of the electrically conductive particles or scales include the particles or scales of silver metal, silver alloy, gold metal, nickel metal, aluminum metal, etc. The particles or scales of silver metal or gold metal are preferably used from the viewpoint of electrically conductive properties, and the particles or scales of silver metal are preferably used from the viewpoint of economical efficiencies. Usually, silver metal particles having a particles size of about 0.1 $\mu$m to about 3 $\mu$m or silver metal scales having a length of about 1 $\mu$m to 20 $\mu$m are preferably used.

Examples of the binder include a polyester-based resin, an epoxy-based resin, and an acrylic resin. The binder may or may not be colored. When particles such as silver particles or nickel particles, or scales such as silver scales or gold scales that are likely to reflect visible light are used as the conductive particles, if the side on which the geometric pattern is formed is placed facing the display so that the opposite side faces the viewer, the surrounding environment may be reflected into the reverse side of the geometric pattern, and conversely, if the side on which the geometric pattern is formed is placed facing the viewer so that the opposite side faces the display, images shown on the display screen may be reflected from the reverse side of the geometric pattern into the display screen; in this case, if a black colored binder is used as the binder, the reflection of visible light by the geometric pattern can be suppressed. To color the binder in black, a coloring material such as a black dye or a black pigment should be added to the binder. For example, carbon, iron oxide or titanium black can be used as the pigment.

The ratio of the conductive particles or scales to the binder used in the conductive paste is selected appropriately in accordance with the targeted electrical resistance of the geometric pattern, adhesion to the substrate, etc. As the amount of the conductive particles used decreases, the adhesion to the substrate becomes greater, and the electrical resistance also becomes greater; conversely, if the amount of the binder used is reduced, the electrical resistance can be reduced but the adhesion to the substrate decreases.

The conductive paste may contain other additives, as in the case of ordinary conductive pastes. Usually, the conductive paste is used by adjusting its viscosity by mixing in a solvent.

The geometric pattern provided on the electromagnetic shield plate of the present invention is formed by repeating a single pattern of an n-gon (n is an integer), for example, a triangle such as an equilateral triangle, an isosceles triangle or a right-angled triangle, a tetragon such as a square, a rectangle, a parallelogram, a rhombus or a trapezoid, a hexagon, an octagon or a dodecagon, or a single pattern of a circle, an ellipse, a trefoil, a petal or a star, or by combining two or more of these patterns.

The pattern consists of lines formed from the electrically conductive paste.

The conductive grid pattern thus formed has a line interval of about 50 to about 250 mesh when expressed in terms of mesh(the number of lines per inch (25.4 mm)) (these convert into about 500 $\mu$m to 100 $\mu$m if expressed in terms of length) and a line width of about 10 $\mu$m to about 80 $\mu$m; preferably the line interval is within the range of about 50 to about 200 mesh and the line width is about 10 $\mu$m and not greater than about 40 $\mu$m.

If the line interval is less than 50 mesh, the geometric pattern tends to become visible, tending to degrade the visibility of the display screen, and if the line interval exceeds 250 mesh, the geometric pattern becomes too fine and the transmittance of light in the visible spectrum decreases, tending to decrease the brightness of the display screen. Likewise, if the line width exceeds about 80 $\mu$m, the geometric pattern tends to become visible, tending to degrade the visibility of the display screen. If the line width is less than about 10 $\mu$m, the geometric pattern tends to become difficult to form, and therefore, the line width is usually 10 $\mu$m or greater.

The line thickness is preferably about 1 $\mu$m or greater, and usually about 30 $\mu$m or less. If the thickness is less than about 1 $\mu$m, the electromagnetic shielding effect tends to become insufficient.

When the line interval is adjusted to obtain approximately the same brightness (light transmittance), printing becomes difficult, but reducing both the line width (to 40 $\mu$m or less) and the line interval is preferable since the electromagnetic shielding effect increases.

In the case of a pattern such as a triangle or a circle, the line interval is expressed as a value as converted to a square pattern, and this value is obtained from the measured value of the line width and the light transmittance.

The conductive geometric pattern may be provided on both sides of the substrate, but usually is provided on one side thereof.

To provide the geometric pattern on the surface of the substrate, the geometric pattern is printed using the conductive paste. When the pattern is formed by printing, displacement of the line interval or distortion of the geometric pattern, which could occur when mounting the metallic mesh, can be suppressed, and production of a large-size electromagnetic shield plate becomes possible.

Screen printing, gravure printing, or offset printing such as intaglio offset printing, letterpress offset printing, planographic offset printing, or a mimeographed offset printing, can be used as the method for printing the geometric pattern. Among them, offset printing is preferable because the geometric pattern having a fine line width of 40 $\mu$m or less can be formed without causing discontinuities of the line, and intaglio offset printing is more preferable because the geometric pattern having a fine line width of 40 $\mu$m or less and a larger thickness can be formed without causing discontinuities of the line.

The thus constructed electromagnetic shield plate of the present invention can provide effective shielding from electromagnetic radiation, but to further enhance the shielding performance, the geometric pattern formed from the conductive paste is preferably covered with a metallic layer or a black colored electro-deposited layer.

Examples of the metal forming the metallic layer include copper, nickel, etc. The metallic layer may be of a single layer structure, or of a multiple layer structure consisting of two or three or more layers. From the viewpoint of visibility, the uppermost layer is preferably a black colored layer which can suppress the reflection of visible light. The thickness of the metallic layer is usually about 50 $\mu$m or less, and preferably about 20 $\mu$m or less and usually not less than about 0.1 $\mu$m.

When covering the geometric pattern with the metallic layer, plating should be applied for the formation of the metallic layer, for example, after the geometric pattern of the conductive paste has been formed. The plating can be done using electroplating or electroless plating, one or the other of which is selected appropriately in accordance with the conductivity of the conductive paste used. It is possible to plating using both electroplating and electroless plating. Especially, it is an effective method for making a variation in thickness of metallic layer small that thin metallic layer is further plated using electroplating after covering thin metallic layer on the geometric pattern using electroless plating. When forming the uppermost layer as a black colored layer, black nickel plating, chromate plating, or black ternary alloy plating using tin, nickel and copper, or black ternary alloy plating using tin, nickel and molybdenum, should be applied for the formation of the black colored layer. It is possible to blacking a surface of a metallic layer by sulfuration treatment or oxidation treatment. It is possible to carrying out such a treatment by well-known methods.

The black colored electro-deposited layer is a black colored layer formed by electro-deposition; this can be formed, for example, by electro-deposition coating of a black paint formed from a black pigment dispersed through an electro-deposition resin. For example, carbon black can be used as the black pigment, and a black pigment having electrical conductivity is preferable. The electro-deposition resin may be an anionic resin or a cationic resin, specific examples including an acrylic resin, a polyester-based resin, and an epoxy-based resin. These electro-deposition resins can be used singly or in any combination thereof.

A geometric pattern comprising an electrically conductive metal is formed by burning a geometric pattern comprising an electrically conductive paste at high temperature and removing organic substance in it.

Before the; burning, it is usually conducted to drying a geometric pattern comprising an electrically conductive paste and removing a solvent in it. A drying temperature is properly determined by considering a boiling point of the solvent in it, etc. This temperature is usually in the range of about 30° C. to about 250° C. The drying is usually conducted using a hot air oven or a infrared light drying furnace.

The burning is usually conducted by using an electric furnace. The burning temperature is usually in the range of about 300° C. to about 700° C. This temperature is properly determined by considering characteristics of material used and conductivity needed to a geometric pattern formed. An atmosphere in the burning is properly chosen by considering characteristics of material, etc. For example, the burning is conducted in atmosphere of air or nitrogen gas, or in a vacuum. It is possible that the burning is conducted twice or more, and that an annealing of a geometric pattern formed is conducted in atmosphere of air or nitrogen gas. In the case of a geometric pattern comprising silver paste, the burning of the geometric pattern is conducted at 600° C. or less, usually in the range of about 500° C. to about 600° C., to decrease a coloring of a substrate. It is considered that the coloring happens by a migration of silver to the substrate.

A geometric pattern comprising an electrically conductive metal oxide is formed by printing a geometric pattern on a substrate using a solution or a colloidal solution containing a compound which generate a metal oxide by burning it, and burning the geometric pattern printed.

Examples of a compound generating a metal oxide include alcoholate of indium or tin, acethylacetonate complex, salt of organic acid such as acetic acid, 2-ethyl hexanoic acid, etc, inorganic salt such as nitride and chloride, etc.

These compound is used as a solution or colloidal solution of alcohol. A geometric pattern is formed by printing using these solutions. Then, a geometric pattern comprising an electrically conductive metal oxide is formed by drying and burning a geometric pattern printed in the same manner as the case of forming a geometric pattern comprising an electrically conductive metal.

The electromagnetic shield plate of the present invention may be provided with a transparent conductive film. To provide the transparent conductive film, the transparent conductive film may be formed over the conductive geometric pattern to cover the entire surface of the electromagnetic shield plate, or it may be formed on the surface thereof opposite from the surface on which the conductive geometric pattern is formed. The transparent conductive film may be deposited directly on the conductive geometric pattern or on the surface of the substrate, but from the viewpoint of the fabrication process, it is preferable to form the transparent conductive film on the surface of a transparent conductive film base and overlay the transparent conductive film base on the electromagnetic shield plate.

The transparent conductive film may be formed as a single-layer transparent conductive film consisting of indium-tin compound oxide (ITO), a multiple-layer transparent conductive film consisting of alternate layers of ITO and low refractive index material, or a multiple-layer transparent conductive film consisting of alternate layers of metallic and high refractive index materials. The multiple-layer transparent conductive film consisting of alternate layers of metallic and high refractive index materials is preferable since it can reduce the reflection of light even when metallic layers are used.

The low refractive index layers used in the multiple-layer transparent conductive film consisting of alternate layers of ITO and low refractive index material are each formed from a material with a lower refractive index than ITO, and a silicon oxide layer is an example of such a layer.

Examples of the metallic materials used for the metallic layers forming the transparent conductive film consisting of metallic layers and high refractive index layers include such metals as silver, gold, platinum, palladium, copper, titanium, chromium, nickel, and zirconium, or alloys containing these metals. Among others, silver or silver alloy is preferable because of its good electrical conductivity, and is used advantageously because it can form a transparent conductive film that can shield near-infrared radiation. The high refractive index layers are layers formed from a material with a high refractive index, usually a refractive index higher than about 1.9. Materials for such high refractive index layers include, for example, indium oxide, tin oxide, ITO, titanium oxide, :tantalum oxide, zirconium oxide and zinc oxide. The visible light reflectance, surface resistance, and other properties of the multiple-layer transparent conductive film are determined by the layer structure of the metallic layers and high refractive index layers, that is, the thickness of the metallic layers, the thickness of the high refractive index layers, the number of metallic layers and high refractive index layers deposited, the order of deposition, etc.

Such a transparent conductive film can be formed by physical vapor deposition such as evaporation, sputtering, or ion plating.

It is preferable that the transparent conductive film is electrically connected to the conductive geometric pattern. The electrical connection can be made, for example, by connecting the transparent conductive film to the conductive geometric pattern using a conductive tape or the like.

The electromagnetic shield plate of the present invention may be coated with a functional film. Examples of the functional film include an antireflective film having an antireflective layer to prevent light reflection on the film surface, a colored film colored with a coloring material or an additive, a near-infrared shielding film which reflects or absorbs near-infrared radiation, and a stainproof film for preventing fingerprints or other contaminants from adhering to the surface.

The electromagnetic shield plate of the present invention provides good visibility and excellent electromagnetic shielding, and a conductive geometric pattern on a surface of a transparent substrate can be produced by printing with good accuracy and in a simple manner. Even a large-size electromagnetic shield plate for use as a front screen plate for a large-area display can be fabricated in a simple manner. The electromagnetic shield plate of the present invention is therefore advantageously as a front panel not only for a cathode ray tube (CRT) but also for a large-screen display such as a plasma display.

EXAMPLES

The present invention will be described in further detail below by way of example, but it will be appreciated that the invention is not limited to the examples illustrated herein.

The electromagnetic shield plate fabricated in each of the following examples was evaluated using the following method.

(1) Light Transmittance

Total light transmittance (Tt) was measured using "Haze Meter" manufactured by Suga Test Instruments Co., Ltd.

(2) The Electromagnetic Shielding Performance

The electromagnetic shielding performance at frequencies of 1 MHz to 1 GHz was measured using an electromagnetic shielding effect measuring instrument ("TR17301" manufactured by Advantest Corporation) and a network analyzer ("8753A" manufactured by Hewlett Packard), and the measured results were expressed as follows: Electromagnetic shielding performance(dB)=$20 \times \log_{10}(X_O/X)$ $X_O$; Strength of electromagnetic waves in the case of not using a electromagnetic shield plate.

X; Strength of electromagnetic waves in the case of using a electromagnetic shield plate.

Reference Example 1

(Production of the Conductive Paste)

90 parts by weight of silver particles ("AgC-B", manufactured by Fukuda Metal Foil & Powder Co., Ltd, particle size: 0.1 µm to 2.0 µm) as electrically conductive particles were mixed with 0.9 parts by weight of coloring material (black carbon "DJ-600". manufactured by Degussa), into which 25.3 parts by weight of polyester resin ("STAFIX ® PL-C", manufactured by Fuji Photo Film Co., Ltd, nonvolatile content: 40%), 6.2 parts by weight of solvent ("DIBASIC ESTERS ® " manufactured by Dupont, Inc.), and 6.0 parts by weight of solvent (ethyl carbitol acetate) were mixed in a roll dispersing machine to disperse the conductive particles through the binder. The binder was colored black with the coloring material (black carbon).

Example 1

(Printing of the Conductive Paste on a Surface of a Substrate)

3.0 parts by weight of solvent (ethyl carbitol acetate) were added per 97 parts by weight of the conductive paste prepared in reference example 1 to adjust its viscosity so that the conductive paste can be used for screen printing. When the viscosity of the conductive paste after adjustment was measured using a rotational viscometer, the results showed 4830 poises at 1 rpm and 625.75 poises at 10 rpm, and the thixotropic ratio was 7.71.

Figure 2:
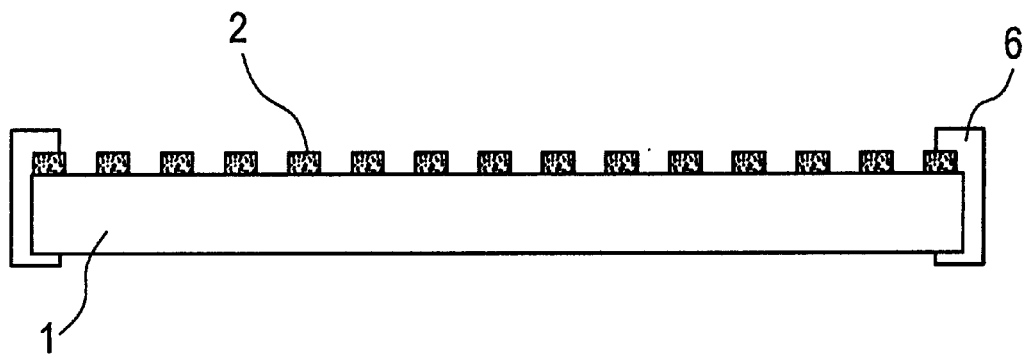
FIG. 2 is a vertical cross sectional view of an electromagnetic shield plate obtained in Example 1.

Using the viscosity adjusted conductive paste and a screen plate with a grid interval of 500 µm (50 mesh) and a grid line width of 40 µm, a conductive grid pattern was printed over the entire area on one side of a glass plate (1) (size: 200 mm×200 mm, thickness: 0.7 mm), thus producing a conductive grid pattern of grid lines (2) formed from the conductive paste. Then, a conductive tape (6) was provided in the circumference of the glass plate on which conductive grid pattern was formed to construct the electromagnetic shield plate. A vertical cross sectional view of this electromagnetic shield plate is shown in FIG. 2.

The resulting conductive grid pattern had a grid interval of 500 µm (50 mesh), a grid line width of 60 µm, and a grid line thickness of 3 µm.

The evaluation results of the thus fabricated electromagnetic shield plate are shown in Table 1.

An electromagnetic shield plate fabricated in the same manner as above, except that the size of the glass substrate is changed, is useful as a front panel for a display, and particularly useful as a front panel for a plasma display panel.

Example 2

Figure 3:
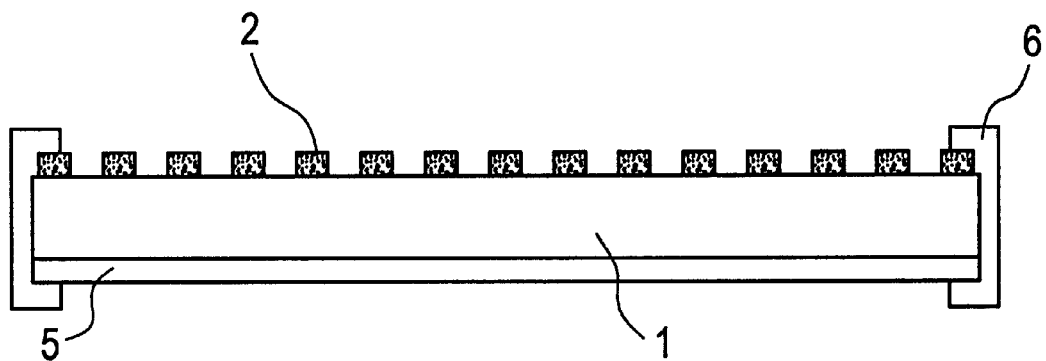
FIG. 3 is a vertical cross sectional view of an electromagnetic shield plate obtained in Example 2.

Using an acrylic adhesive material, a transparent conductive film (5) (ALTAIR® XIR film manufactured by Southwall Technologies Inc., U.S.A.) was overlaid, with its transparent conductive layer side facing outward, onto the surface of the electromagnetic shield plate of the example 1 opposite from the surface thereof on which the conductive grid pattern was formed. Next, the transparent conductive layer of the transparent conductive film was electrically connected to the conductive grid pattern by a conductive tape (6). A vertical cross sectional view of this electromagnetic shield plate is shown in FIG. 3.

The evaluation results of the thus fabricated electromagnetic shield plate are shown in Table 3.

Example 3

An electromagnetic shield plate fabricated in the same manner as in the example 1 was first immersed in conc. hydrochloric acid (concentration: 35%) for one minute, and then immersed inacopperplating solution [1 liter of solution prepared by mixing copper sulfate pentahydrate (180 g), sulfuric acid (27 g) and ion exchange water, temperature: 25° C.]. The pH of the copper plating solution was 0.7. An electrolytic copper electrode was immersed in the copper plating solution and, by using the electromagnetic shield plate as the negative electrode and the electrolytic copper electrode as the positive electrode, a voltage of 3 V was applied between the electrodes for three minutes to carry out copper plating, thus covering the grid lines with a copper layer (3). The thickness of the copper layer was 3 µm.

Figure 4:
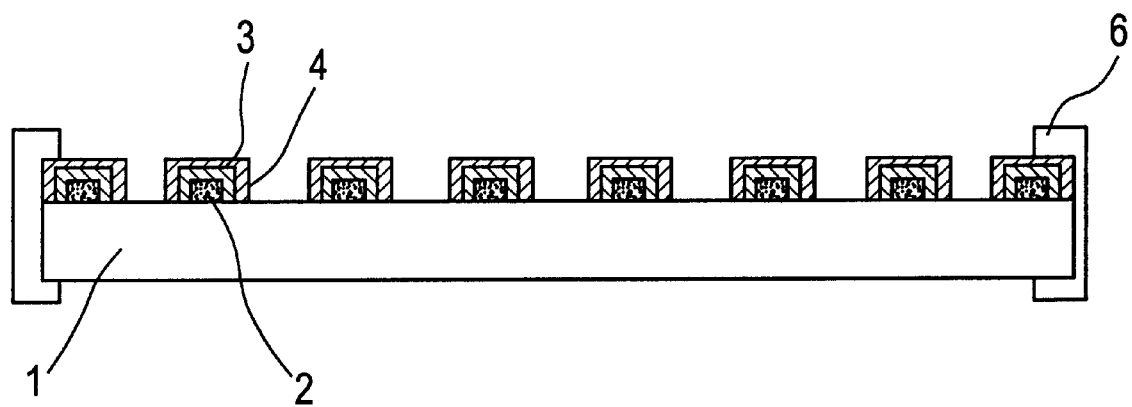
FIG. 4 is a vertical cross sectional view of an electromagnetic shield plate obtained in Example 3.

Next, the electromagnetic shield plate treated with the copper plating was immersed in a nickel plating solution [1 liter of solution prepared by mixing nickel sulfate hexahydrate (75 g), ammonium nickel sulfate (44 g), zinc sulfate (30 g), sodium thiocyanate (20 g) and ion exchange water, temperature: 55° C.]. The pH of the nickel plating solution was 4.5. An electrolytic nickel electrode was immersed in the nickel plating solution and, by using the electromagnetic shield plate as the negative electrode and the electrolytic nickel electrode as the positive electrode, a voltage of 3 V was applied between the electrodes for one minute to carry out black nickel plating, thus forming a nickel layer (4) as the uppermost layer over the copper layer (3). Then, a conductive tape (6) was provided in the circumference of the glass plate on which conductive grid pattern was formed to construct the electromagnetic shield plate. A vertical cross sectional view of this electromagnetic shield plate is shown in FIG. 4.

The uppermost layer was black in color. The thickness of the nickel layer was 3 $\mu$m and, after the black nickel plating, the grid line width was 70 $\mu$m and its thickness was 9 $\mu$m.

The evaluation results of the electromagnetic shield plate treated with the black nickel plating are shown in Table 1. When this electromagnetic shield plate was observed visually from the side on which the conductive grid pattern was formed, the. conductive grid pattern was virtually invisible.

An electromagnetic shield plate fabricated in the same manner as above, except that the size of the glass substrate used in the example 1 is changed, is useful as a front panel for a display, and particularly useful as a front panel for a plasma display.

Example 4

Using an acrylic adhesive material, the same transparent conductive film (5) as used in the example 2 was overlaid, with its transparent conductive layer side facing outward, onto the side of the electromagnetic shield plate of the example 3 opposite from the side thereof on which the conductive grid pattern was formed. Next, the transparent conductive layer of the transparent conductive film was electrically connected to the conductive grid pattern by a conductive tape (6).

A vertical cross sectional view of this electromagnetic shield plate is shown in FIG. 1.

The evaluation results of the thus fabricated electromagnetic shield plate are shown in Table 1.

When this electromagnetic shield plate was observed visually from the side on which the conductive grid pattern was formed, the conductive grid pattern was virtually invisible. An electromagnetic shield plate fabricated in the same manner as above, except that the size of the glass substrate used in the example 1 is changed, is useful as a front panel for a display, and particularly useful as a front panel for a plasma display.

Example 5

The same process as used in the example 3 was performed to cover the grid lines with the copper layer, except that the electromagnetic shield plate fabricated in the same manner as in the example 1 was replaced by an electromagnetic shield plate in-which a conductive grid pattern [grid interval: 250 $\mu$m (100 mesh), width of grid line: 27 $\mu$m, and thickness of grid line: 5 $\mu$m] was formed by intaglio offset printing on a glass substrate(size: 200 mm×200 mm, thickness: 1.1 mm). The thickness of the copper layer was 3 $\mu$m.

Next, the same process as used in the example 3 was performed to apply black nickel plating for the formation of a nickel layer. Then, a conductive tape was provided in the circumference of the glass plate on which conductive grid pattern was formed to construct the electromagnetic shield plate.

The thickness of the nickel layer was 3 $\mu$m, and the width of the grid line was 33 $\mu$m and its thickness was 30 $\mu$m.

The evaluation results of the thus fabricated electromagnetic shield plate are shown in Table 1. When this electromagnetic shield plate was observed visually from the side on which the conductive grid pattern was formed, the conductive grid pattern was virtually invisible.

An electromagnetic shield plate fabricated in the same manner as above, except that the size of the glass substrate used is changed, is useful as a front panel for a display, andparticularlyuseful as a front panel for a plasma display

Example 6

An electromagnetic shield plate, with a conductive grid pattern (grid interval: 250 $\mu$m (100 mesh), line width: 35 $\mu$m) formed by intaglio offset printing on a polyester film (size: 300 mm ×400 mm, thickness: 100 $\mu$m), was first degreased (immersed for five minutes in a 50 g/L solution of ACECLEAN®A-200 held at 50° C.), and then immersedin a solution of sulfuric acid (concentration: conc. sulfuric acid 100 ml/L, room temperature) for two minutes. Thereafter, the shield plate was immersed in a copper plating solution (1 liter of solution prepared by mixing 70 g of copper sulfate pentahydrate, 200 g of conc. sulfuric acid, and ion exchange water, room temperature ) to perform plating for 10 minutes at 0.8 V. The copper layer thickness, when measured by a fluorescence X-ray method, was 1.8 $\mu$m. Next, the shield plate was immersed in a black nickel plating solution BKN CONC manufactured by Murata Mfg. Co., Ltd, concentration: BKN-CONC 500 ml/L, temperature: 35° C.) to perform plating for five minutes at 0.8 V.

Then, a conductive tape was provided in the circumference of the electromagnetic shield plate.

The line width, after the black plating, was 44 $\mu$m. The evaluation results of the thus fabricated electromagnetic shield plate are shown in Table 1.

Example 7

An electromagnetic shield plate was fabricated in the same manner as in the example 6, except that the duration of the copper plating was extended to 20 minutes.

The resulting copper plating thickness was 2.5 $\mu$m, and the line width, after the black nickel plating, was 53 $\mu$m. The evaluation results of the thus fabricated electromagnetic shield plate are shown in Table 1.

Example 8

An electromagnetic shield plate was fabricated in the same manner as in the example 6, except that a conductive grid pattern with a grid interval of 195 $\mu$m (130 mesh) and a line width of 17 $\mu$m was formed by intaglio offset printing on the polyester film, and that the duration of the copper plating was shortened to five minutes.

The line width, after the black nickel plating, was 19 $\mu$m. The evaluation results of the thus fabricated electromagnetic shield plate are shown in Table 1.

TABLE 1

|  | Line interval (mesh) | Line width (μm) | Transmittance (%) | Electromagnetic shielding performance (dB) | | | |
|---|---|---|---|---|---|---|---|
|  |  |  |  | 30 MHz | 530 MHz | 70 MHz | 100 MHz |
| Example 1 | 50 | 70 | 75.4 | 40 | 40 | 40 | 40 |
| Example 2 | 50 | 70 | 62.6 | 63 | 57 | 53 | 48 |
| Example 3 | 50 | 93.3 | 63.6 | 50 | 50 | 50 | 50 |
| Example 4 | 50 | 93.3 | 53.1 | 70 | 90 | 79 | 90 |
| Example 5 | 100 | 33 | 73 | 55 | 55 | 55 | 55 |
| Example 6 | 100 | 44 | 61 | 52 | 51 | 51 | 52 |
| Example 7 | 100 | 53 | 57 | 55 | 56 | 56 | 56 |
| Example 8 | 130 | 19 | 68 | 53 | 53 | 53 | 53 |

What is claimed is:

1. An electromagnetic shield plate comprising a geometric pattern having a line width of 10 μm to 80 μm and a line interval of 50 to 250 mesh on a surface of a transparent substrate, wherein the geometric pattern comprises an electrically conductive paste which is a paste comprising electrically conductive particles or scales and a black colored binder.

2. An electromagnetic shield plate according to claim 1, wherein the line width is in the range of 10 μm to 40 μm and the line interval is in the range of 50 to 200 mesh.

3. A method for producing the electromagnetic shield plate according to claim 1 or 2, wherein the geometric pattern is formed by printing on the substrate by using the electrically conductive paste.

4. A method for producing the electromagnetic shield plate according to claim 3, wherein the printing is done by offset printing, screen printing or gravure printing.

5. A method for producing the electromagnetic shield plate according to claim 3, wherein the printing is done by intaglio offset printing.

6. An electromagnetic shield plate according to claim 1, wherein the geometric pattern comprises the electrically conductive paste which is covered with a metallic layer or a black electro-deposition layer.

7. A fabrication method for an electromagnetic shield plate according to claim 6, wherein the geometric pattern formed from the electrically conductive paste is provided on the substrate, and plating is then applied thereon.

8. A front panel for a display comprising the electronic shield according to claim 6.

9. A method of producing the-electromagnetic shield plate according to claim 6, wherein the geometric pattern is Iformedrbr y prnting on the substrate by using the electrically conductive paste.

10. A method for producing the electromagnetic shield plate according to claim 9, wherein the printing is done by offset printing, screen printing or gravure printing.

11. A method for producing the electromagnetic shield plate according to claim 9, wherein the printing is done by intaglio offset printing.

12. An electromagnetic shield plate according to claim 1, wherein the geometric pattern is formed by an intaglio offset printing on the substrate by using the electrically conductive paste.

13. A front panel for a display comprising the electromagnetic shield plate according to claims 1, 2 or 12.

14. An electromagnetic shield plate comprising a geometric pattern having a line width of 10 μm to 80 μm and a line interval of 50 to 250 mesh on a surface of a transparent substrate, wherein the geometric pattern comprises an electrically conductive metal which is formed by burning a geometric pattern comprising an electrically conductive paste which is a paste comprising electrically conductive particles or scales and a black colored binder, and removing organic substance in the electrically conductive paste.

15. An electromagnetic shield plate according to claim 14, wherein the geometric pattern comprises the electrically conductive metal which is covered with a metallic layer or a black electro-deposition layer.

16. An electromagnetic shield plate according to claim 14, he geometric pattern is formed by an intaglio offset printing on the by using the electrically conductive paste.

17. An electromagnetic shield plate according to claim 14, further comprising the step of drying the geometric pattern at a temperature of from about 30 to about 250° C. prior to burning.

18. An electromagnetic shield plate according to claim 14, wherein the burning is conducted at a temperature of from about 300° C. to about 700° C.

19. An electromagnetic shield plate comprising a geometric pattern having a line width of 10 μm to 80 μm and a line interval of 50 to 250 mesh on a surface of a transparent substrate, wherein the geometric pattern comprises an electrically conductive metal oxide which is formed by burning a geometric pattern formed from a solution or a colloidal solution containing a compound which generates a metal oxide by burning.

20. An electromagnetic shield plate according to claim 14, or 19, wherein the line width is in the range of 10 μm to 40 μm and the line interval is in the range of 50 to 200 mesh.

21. An electromagnetic shield plate according to claim 19, wherein the geometric pattern comprises the electrically conductive metal oxide which is covered with a metallic layer or a black electro-deposition layer.

22. A front panel for a display comprising the electromagnetic shield plate according to claims 14, 19, 15, 21, 16, 17, or 18.

* * * * *